(12) United States Patent
Ding et al.

(10) Patent No.: US 11,467,230 B2
(45) Date of Patent: Oct. 11, 2022

(54) EXTENSION MEMBER FOR DEVICES USING MAGNETIC FIELD DETECTION

(71) Applicant: Google LLC, Mountain View, CA (US)

(72) Inventors: Yao Ding, San Jose, CA (US); Eric Daniels, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/889,609

(22) Filed: Feb. 6, 2018

(65) Prior Publication Data
US 2019/0242954 A1    Aug. 8, 2019

(51) Int. Cl.
| | |
|---|---|
| *G01R 33/07* | (2006.01) |
| *H03K 17/95* | (2006.01) |
| *H03K 17/97* | (2006.01) |
| *A45C 11/00* | (2006.01) |
| *A61J 1/03* | (2006.01) |
| *A45C 13/10* | (2006.01) |
| *A45C 11/16* | (2006.01) |

(52) U.S. Cl.
CPC ............ *G01R 33/072* (2013.01); *A45C 11/16* (2013.01); *A45C 13/1069* (2013.01); *A61J 1/03* (2013.01); *H03K 17/9515* (2013.01); *H03K 17/9517* (2013.01); *H03K 17/97* (2013.01); *A45C 2011/007* (2013.01); *H03K 2017/9713* (2013.01)

(58) Field of Classification Search
CPC ... G01R 33/072; A45C 11/16; A45C 13/1069; A61J 1/03
See application file for complete search history.

(56) References Cited

U.S. PATENT DOCUMENTS

| | | | |
|---|---|---|---|
| 5,369,361 A | 11/1994 | Wada | |
| 5,444,369 A * | 8/1995 | Luetzow | G01B 7/30 123/376 |
| 6,304,078 B1 * | 10/2001 | Jarrard | G01B 7/003 324/207.2 |

(Continued)

FOREIGN PATENT DOCUMENTS

| | | | |
|---|---|---|---|
| CN | 205006169 U | | 2/2016 |
| FI | WO 2015114214 | * | 6/2015 |

(Continued)

OTHER PUBLICATIONS

International Search Report and Written Opinion for PCT Application No. PCT/US2019/013022 dated Apr. 12, 2019. 14 pages.

(Continued)

*Primary Examiner* — Feba Pothen
(74) *Attorney, Agent, or Firm* — Lerner, David, Littenberg, Krumholz & Mentlik, LLP (57) ABSTRACT

The technology provides for an extension member configured to direct a magnetic field from a magnet to a Hall Effect sensor to facilitate detection of magnetic field. By varying the dimensions of the extension member, which may be any arbitrary shape, the relative positions of the magnet and the Hall Effect sensor may be less constrained by the reach of the magnetic field of the magnet, thereby allowing more design possibilities. The extension member may be used in a case, where the extension member may facilitate detection of whether the case is open or closed, the extension member may further provide magnetic attraction to keep the case closed.

17 Claims, 10 Drawing Sheets

(56) References Cited

U.S. PATENT DOCUMENTS

| | | | |
|---|---|---|---|
| 6,557,412 B1* | 5/2003 | Barbier | G01F 23/74 |
| | | | 340/623 |
| 7,559,913 B1* | 7/2009 | Jeppsson | A61M 1/28 |
| | | | 604/29 |
| 9,742,456 B2* | 8/2017 | Park | H04M 1/0243 |
| 2002/0175679 A1 | 11/2002 | Kim et al. | |
| 2003/0112006 A1* | 6/2003 | Luetzow | G01D 5/145 |
| | | | 324/207.21 |
| 2004/0017186 A1* | 1/2004 | Viola | G01D 5/145 |
| | | | 324/207.2 |
| 2006/0192553 A1* | 8/2006 | Recio | G01D 5/145 |
| | | | 324/207.24 |
| 2010/0001715 A1 | 1/2010 | Doogue et al. | |
| 2010/0007402 A1 | 1/2010 | Chamuczynski et al. | |
| 2010/0231198 A1 | 9/2010 | Bose et al. | |
| 2010/0298032 A1* | 11/2010 | Lee | G06F 1/1616 |
| | | | 455/566 |
| 2014/0043121 A1 | 2/2014 | Sartee et al. | |
| 2015/0222736 A1 | 8/2015 | Oh | |

FOREIGN PATENT DOCUMENTS

| | | |
|---|---|---|
| JP | 2012123611 A | 6/2012 |
| TW | 533311 B | 5/2003 |
| TW | 201109700 A | 3/2011 |
| TW | 201217757 A | 5/2012 |
| WO | 8101346 A1 | 5/1981 |

OTHER PUBLICATIONS

Office Action for Taiwanese Patent Application No. 107129986 dated Jul. 26, 2019.
Taiwanese Office Action for Application No. TW 107129986 dated Jan. 20, 2020, 9 pages.
Decision of Rejection for Taiwanese Patent Application No. 107129986 dated Jun. 17, 2020. 7 pages.
International Preliminary Report on Patentability for PCT Application No. PCT/US2019/013022 dated Aug. 20, 2020. 9 pages.
Notification of the First Office Action for Chinese Patent Application No. 201980007689.1 dated Jul. 28, 2021. 8 pages.
Office Action for European Patent Application No. 19707900.7 dated Apr. 11, 2022. 9 pages.

* cited by examiner

EXTENSION MEMBER FOR DEVICES USING MAGNETIC FIELD DETECTION

BACKGROUND

A case, such as a jewelry box or a pillbox, may have magnets mounted on both covers of the case to help hold the case closed. This way, for example, when the case is dropped, the contents inside the case would not fall out.

For a case that contains electronic components inside, the functions of the components may depend on whether the case is open or closed. Optical sensors, e.g., Infrared (IR) sensors, and magnetic field sensors, e.g., Hall Effect sensors, may be used to detect whether the case is open or closed by proximity detection. However, IR sensors require a window for light to pass through, and also require more power to operate than a Hall Effect sensor. Hall Effect sensors, on the other hand, may be constrained by the dimensions of the case, since magnetic field strength drops off quickly with distance.

SUMMARY

The present disclosure provides for an extension member, comprising a first end adapted to be coupled to a magnet, a second end adapted to be coupled to a Hall Effect sensor, and an elongated body extending between the first end and the second end, the elongated body being formed from a material capable of transferring a magnetic field of the magnet from the first end to the second end.

The second end of the extension member may be positioned away from first end in both x and y directions. The first end and the second end may face the same direction. The second end may be positioned away from the first end in x, y, and z directions.

The extension member may have a low remanence. The extension member may be made of a soft iron material.

The present disclosure further provides for a device, comprising a magnet, a Hall Effect sensor, and an extension member having a first end adapted to be coupled to the magnet, a second end adapted to be coupled to the Hall Effect sensor, and an elongated body extending between the first end and the second end, the elongated body being formed from a material capable of transferring a magnetic field of the magnet from the first end to the second end.

The extension member of the device may be configured such that a distance between the magnet and the extension member can be changed. The extension member may be configured so that the sensor is able to detect the magnetic field of the magnet when the distance between the magnet and the extension member is within a first predetermined threshold distance. The extension member may be configured such that the sensor is not able to detect the magnetic field of the magnet when the distance between the magnet and the extension member is greater than a second predetermined threshold distance. The extension member may be configured such that a distance between the extension member and the sensor can be changed.

The magnet of the device may be one of a permanent magnet or an electromagnet.

The disclosure further provides for a case, comprising a first cover, a second cover, the second cover capable of being attached to or separated from the first cover, a magnet mounted in the first cover, a Hall Effect sensor mounted in the second cover, and an extension member mounted in the second cover, the extension member having a first end adapted to be coupled to the magnet, a second end adapted to be coupled to the Hall Effect sensor, and an elongated body extending between the first end and the second end, the elongated body being formed from a material capable of transferring a magnetic field of the magnet from the first end to the second end.

The case may further comprise at least one electrical component connected to the sensor, the electrical component configured to switch on or off depending on an output of the sensor. The electrical component may switch on when the output of the sensor is above a first predetermined threshold value. The electrical component may switch off when an output of the sensor is below a second predetermined threshold value.

The case may further comprise a cover layer sealing the sensor such that the sensor is protected from environmental contaminants.

DETAILED DESCRIPTION

Overview

The technology generally relates to an extension member configured to direct a magnetic field from a magnet to a Hall Effect sensor. Where compactness is preferred or required in a device having a Hall Effect sensor, it may not be possible or practical to position the Hall Effect sensor in a location where the magnetic field of the magnet can be detected by the Hall Effect sensor. In such situations, an extension member may be used to transfer the magnetic field from the magnet to the Hall Effect sensor. Such an extension member may further provide magnetic attraction to the magnet to hold various components together.

In one example, the extension member may have a first end adapted to be coupled to the magnet, a second end adapted to be coupled to the Hall Effect sensor, and an elongated body extending between the first end and the second end, the elongated body being formed from a material capable of transferring a magnetic field of the magnet from the first end to the second end. The second end may be positioned away from the first end in only one of the x, y, or z direction, in both the x and y, x and z, or y and z directions, or in all three x, y, and z directions. The extension member may be J-shaped, L-shaped, I-shaped, or some other arbitrary shape, so long as it is capable of transferring the magnetic field from the magnet to the Hall Effect sensor. Therefore, by varying the dimensions of the extension member, the relative positions of the magnet and the Hall Effect sensor may be less constrained by the reach of the magnetic field of the magnet, thereby allowing more design possibilities. The extension member may be made of a soft iron core having a low remanence, for example, from 0.1 mT to 1 mT. By way of example only and not limitation, the extension member may have a surface magnetic field ("B-field") of 200 mT when placed near a N52 permanent magnet, and a surface B-field of less than 1 mT when the N52 permanent magnet is removed. It should be understood, however, that that these example values may be higher or lower in other examples. Examples of soft iron materials may include low carbon steels, iron silicon alloys, nickel iron alloys, soft ferrites, amorphous or nanocrystalline alloys, etc. The magnet may be a permanent magnet, e.g., a ferrite magnet, or an electromagnet, e.g., a solenoid wrapped around a ferromagnetic core.

In another example, an extension member may be used to direct a magnetic field from a magnet to a Hall Effect sensor in a case to detect whether the case is open or closed. The magnet may be mounted in a first cover of the case, while the Hall Effect sensor and the extension member may be mounted in a second cover of the case. The extension member may have one end facing the Hall Effect sensor at all times, and another exposed end facing the magnet only when the first cover comes in contact with the second cover. The Hall Effect sensor may also be connected to at least one electrical component, e.g., a charging circuit, such that the electrical component switches on when an output of the Hall Effect sensor is above a first predetermined threshold value, and switches off when the output of the Hall Effect sensor is below a second predetermined threshold value. By choosing the Hall Effect sensor and the extension member with optimal hysteresis curves, the case may be designed to prevent the Hall Effect sensor from switching on and off the electrical component when a very small variation in magnetic field results from noise. The Hall Effect sensor may also be sealed by a cover layer such that it is protected from environmental contaminants.

The technology described herein is advantageous in a number of ways. For example, compared to an infrared proximity sensor, a Hall Effect sensor costs less, consumes less power, and can be completely concealed. Where compactness is preferred or required, an extension member may be used to transfer a magnetic field from a magnet to the Hall Effect sensor without having to compromise the locations of the various components. In a device where a holding force between two components are desired, the extension member may further provide the holding force with the magnet without a need for a second magnet. Using a low remanence material, the extension member may be designed to both transfer the magnetic field and provide the holding force. The Hall Effect sensor and the extension member may also be selected based on their hysteresis curves to prevent unwanted responses to noise. The disclosed technology may further protect the Hall Effect sensor from environmental contaminants, which may prolong the life of the device.

Example Devices

Figure 1:
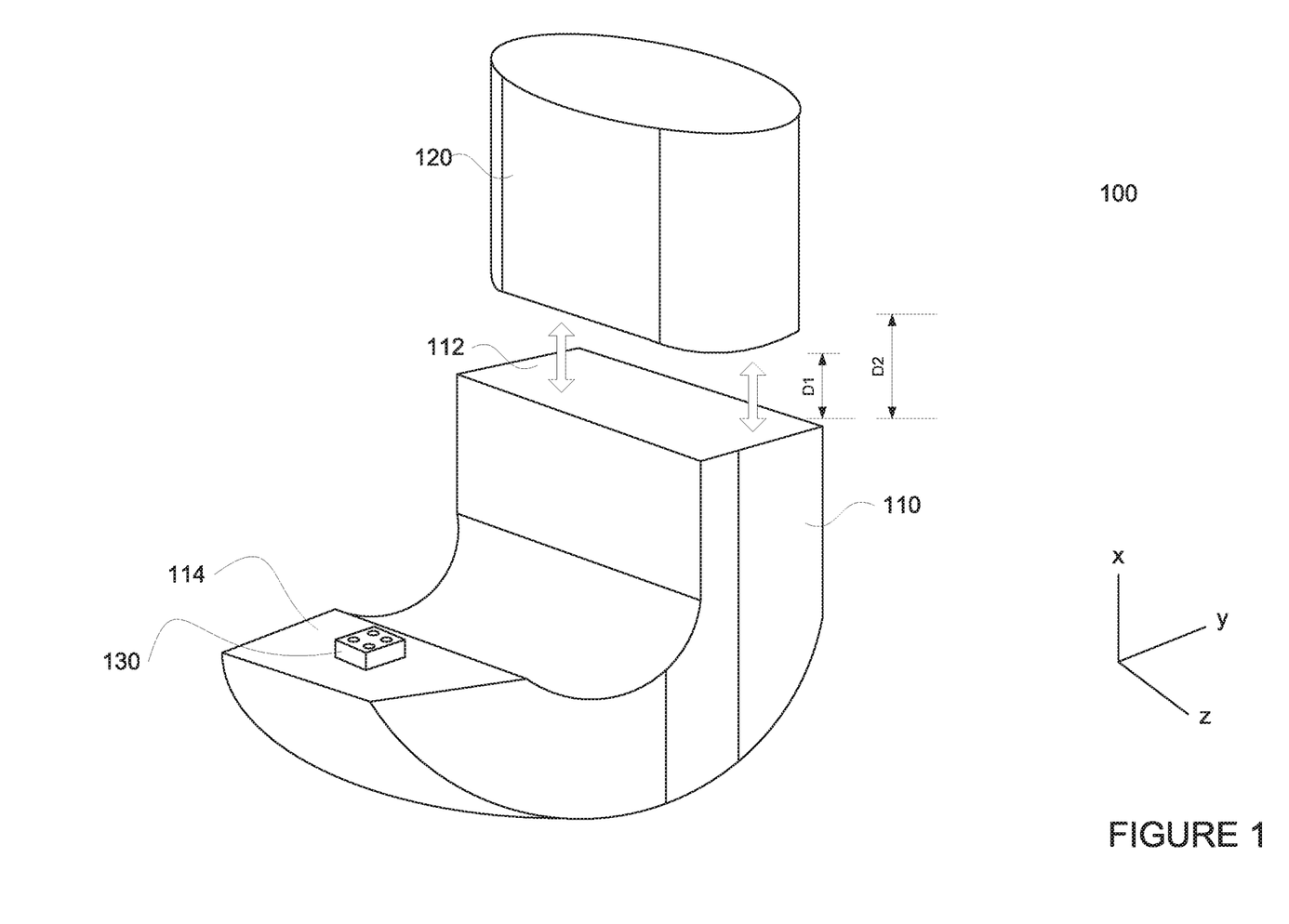
FIG. 1 illustrates an example device in accordance with aspects of the disclosure.

FIG. 1 shows an example device 100 where an extension member 110 is used to direct a magnetic field from a magnet 120 to a Hall Effect sensor 130. In this example, the extension member 110 has a first end 112 adapted to be coupled to the magnet 120, and a second end 114 adapted to be coupled to the Hall Effect sensor 130. The extension member 110 in this example is J-shaped—the second end 114 is positioned away from the first end 112 in both x- and y-directions, but the first end 112 and the second end 114 both face the same x-direction. As explained below, the extension member 110, the magnet 120, and the Hall Effect sensor 130 may each be chosen based on desired magnetic properties.

Figure 2:
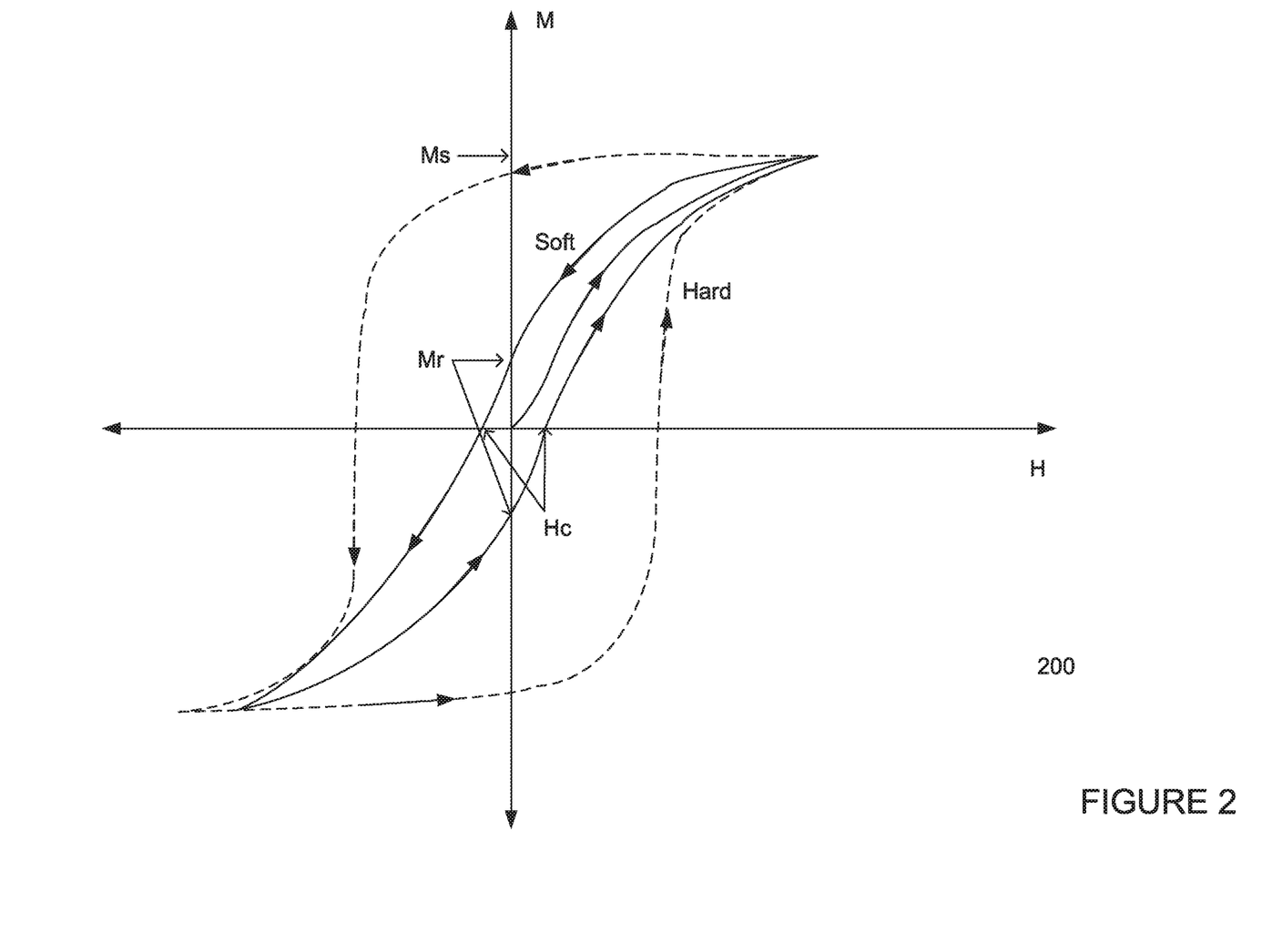
FIG. 2 illustrates example hysteresis curves.

For example, the extension member 110 may be chosen based on its magnetic hysteresis curve. FIG. 2 illustrates some example magnetic hysteresis curves 200. The graph plots magnetization M against magnetic field strength H. The solid curve represents an example hysteresis curve for a soft iron material, while the dotted curve represents an example hysteresis curve for a hard iron material. As illustrated by both curves, magnetic hysteresis occurs when the relationship between magnetic strength H and magnetization M of a material is non-linear.

Looking at the solid curve, it is made of two portions: (1) a curve starting from origin called the initial magnetization curve, and (2) a curve that forms a loop called the main loop. Starting with the initial magnetization curve, the curve begins with the material being not magnetized (M=0) and without any external magnetic field applied to it (H=0). Then, as an external magnetic field (H>0) is applied to the material, the magnetization M of the material increases as shown by the upwards arrow on the initial magnetization curve. Eventually, the magnetization M approaches an asymptote called magnetic saturation Ms.

If, at this point, the external magnetic field H is decreased, the magnetization M of the material would not follow the same initial magnetization curve back to the origin; instead, the magnetization M of the material follows the portion of the main loop indicated by the downwards arrows, which crosses the M-axis at a point called remanence Mr. This means that, even when the magnetic field strength H is completely removed (H=0), the material remains magnetized (M=Mr). In fact, after the initial magnetization, to completely remove the magnetization M from the material, some magnetic field strength (H=Hc) in the opposite polarity is required to completely remove the magnetization M from the material, this is known as the coercivity Hc. Continuing with the main loop, as the magnetic field strength H increases in the reversed polarity, the magnetization M of the material also reverses polarity and eventually reaches a magnetic saturation with an opposite polarity. Finally, the portion of the main loop indicated by the upwards arrows is analogous to the portion indicated by the downwards arrows.

When the magnetic hysteresis curve of a material shows a low coercivity and/or a low remanence, the material is considered magnetically "soft." On the other hand, if the magnetic hysteresis curve of a material shows a high coercivity and/or a high remanence, the material is considered magnetically "hard."

Using the magnetic hysteresis curves, a suitable material may be chosen for the extension member. For example, a suitable material may be chosen based on the shape of the curve (e.g., narrow v. wide). As another example, a suitable material may be chosen based on its remanence and/or coercivity values such that, when a magnet of a predetermined strength comes within a first predetermined threshold distance of the material, the material would be magnetized to an extent detectable by a sensor having a predetermined sensitivity. As yet another example, a suitable material may be chosen based on its remanence and/or coercivity values such that, when a magnet of a predetermined strength moves away beyond a second predetermined threshold distance from the material, the material would be demagnetized to an extent no longer detectable by a sensor having a predetermined sensitivity. By way of example only and not limitation, stainless steel SUS 17-4PH may be chosen as the material for an extension member because when a magnet having a strength of 0.1 T comes within 2 mm of the stainless steel SUS 17-4PH extension member, the stainless steel SUS 17-4PH extension member becomes magnetized to an extent detectable by a Hall Effect sensor having a 3.5 mT sensitivity.

Returning to FIG. 1, the extension member 110 is a soft iron core having a low remanence, which means that the extension member 110 may be easily magnetized and demagnetized. Alternatively, the extension member may be made of another material with low remanence. Examples of soft iron materials may include low carbon steels, iron silicon alloys, nickel iron alloys, soft ferrites, amorphous or nanocrystalline alloys, etc.

The magnet 120 may be a permanent magnet, e.g., a ferrite magnet, or an electromagnet, e.g., a solenoid wrapped around a ferromagnetic core. For instance, depending on whether the magnet 120 is moving towards or away from the first end 112 of the extension member 110, a variation in magnetic field strength may be detected by the Hall Effect sensor 130 through the second end 114 of the extension member 110.

The device in this example is configured such that the magnet 120 may move relative to the extension member 110, while the Hall Effect sensor 130 may not move relative to the extension member 110. For example, as the magnet 120 approaches the extension member 110, the magnetic field strength of the magnet 120 applied on the extension member 110 increases as the distance between the magnet 120 and the extension member 110 decreases. For example, when the magnet 120 and the extension member 110 are within a first predetermined threshold distance D1, the extension member 110 may be quickly magnetized by the magnet 120 to an extent such that the extension member 110 may transfer a magnetic field detectable by the Hall Effect sensor 130. As shown in FIG. 2, except for an initial magnetization, the first predetermined threshold distance D1 may be correlated with the coercivity Hc of the extension member 110. The first predetermined threshold distance D1 may also be correlated with a magnetic field strength of the magnet 120 and a sensitivity of the Hall Effect sensor 130.

Then, as the magnet 120 moves away from the extension member 110, the magnetic field strength of the magnet 120 applied on the extension member 110 decreases as the distance between the magnet 120 and the extension member 110 increases. For example, when a distance between the magnet 120 and the extension member 110 becomes greater than a second predetermined threshold distance D2, the extension member 110 may be quickly demagnetized to an extent such that the extension member 110 no longer transfer a magnetic field detectable by the Hall Effect sensor 130. As shown in FIG. 2, the second predetermined threshold distance D2 may be correlated with the remanence Mr of the extension member 110. The second predetermined threshold distance D2 may also be correlated with the magnetic field strength of the magnet 120 and the sensitivity of the Hall Effect sensor 130.

Depending on the magnetic hysteresis curve of the extension member 110, the first predetermined threshold distance D1 may be different from the second predetermined threshold distance D2. For example, the first predetermined threshold distance may be 1 mm-2 mm, while the second predetermined threshold distance may be 3 mm-4 mm.

Although the extension member 110 in this example is J-shaped, it may be any of a number of shapes, J-shaped, L-shaped, I-shaped, etc., so long as it is capable of transferring the magnetic field from the magnet to the Hall Effect sensor. The second end of the extension member may be positioned away from the first end in only one of the x, y, or z direction, in both the x and y, x and z, or y and z directions, or in all three x, y, and z directions. Further, the first end and the second end may face the same direction or different directions. Still further, the extension member may consists of multiple portions coupled to each other.

Figure 3:
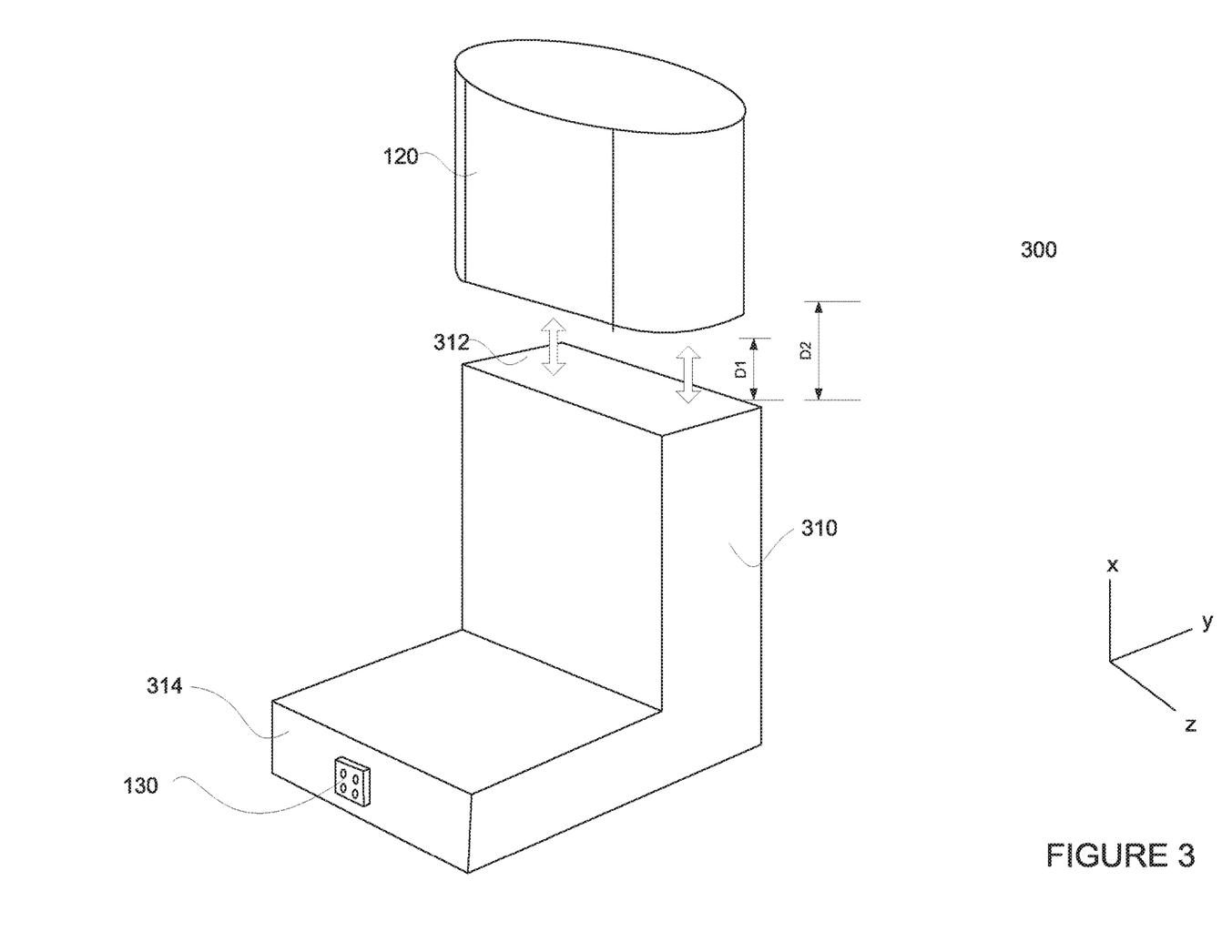
FIG. 3 illustrates an example device in accordance with aspects of the disclosure.

FIG. 3 shows an example device 300 where an extension member 310 is L-shaped. The extension member 310 has a first end 312 adapted to be coupled to the magnet 120, and a second end 314 adapted to be coupled to the Hall Effect sensor 130. Here, the second end 314 is positioned away from the first end 312 in both x- and y-directions, where the first end 312 faces the x-direction while the second end 314 faces the y-direction.

Figure 4:
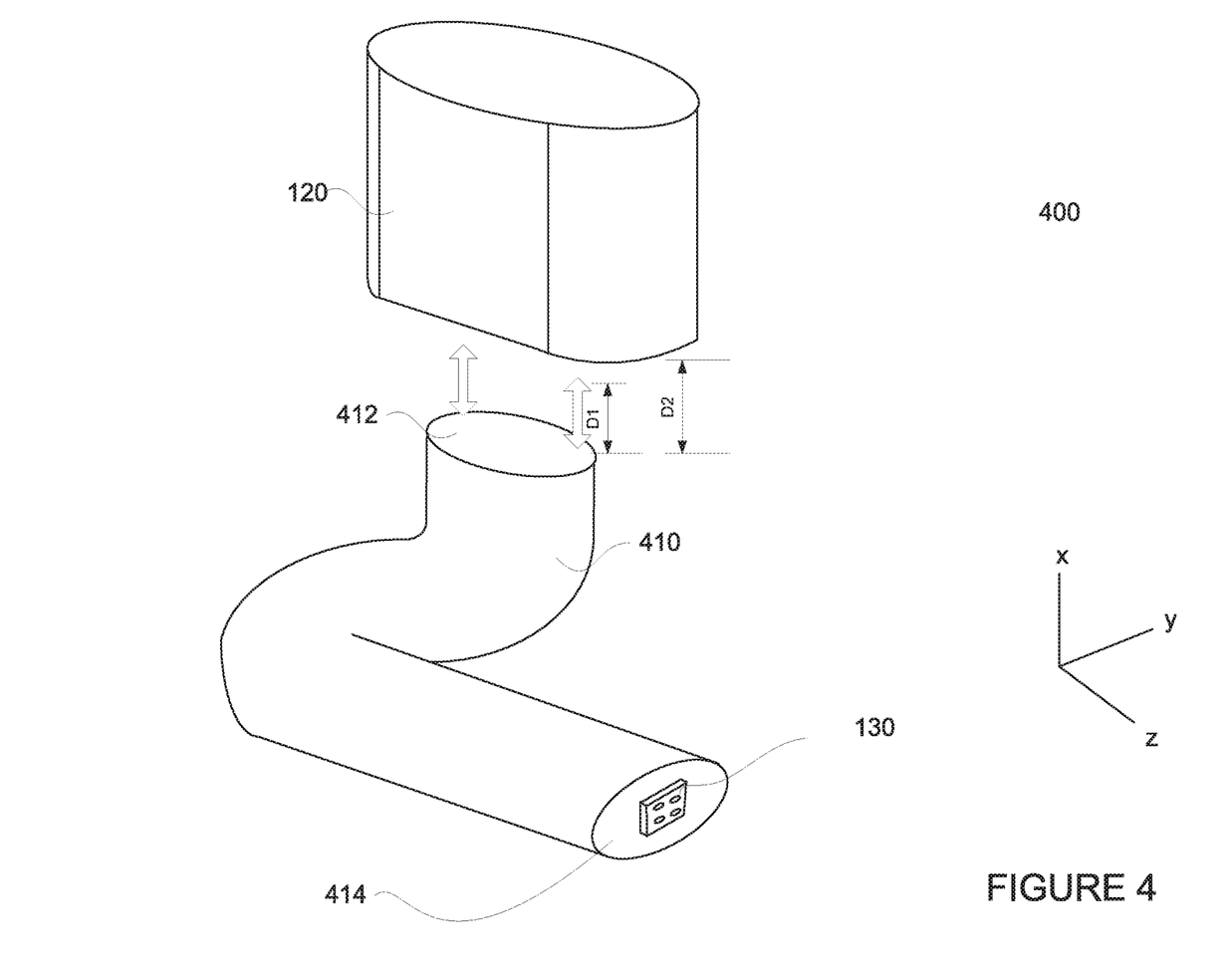
FIG. 4 illustrates an example device in accordance with aspects of the disclosure.

FIG. 4 shows an example device 400 where an extension member 410 is arbitrarily shaped. The extension member 410 has a first end 412 adapted to be coupled to the magnet 120, and a second end 414 adapted to be coupled to the Hall Effect sensor 130. Here, the second end 414 is positioned away from the first end 412 in all three x-, y-, and z-directions, where the first end 412 faces the x-direction while the second end 414 faces the z-direction. It should be understood that the arbitrary shape illustrated is merely an example, and that any of a variety of arbitrary shapes extending in one or more directions may be used.

Figure 5:
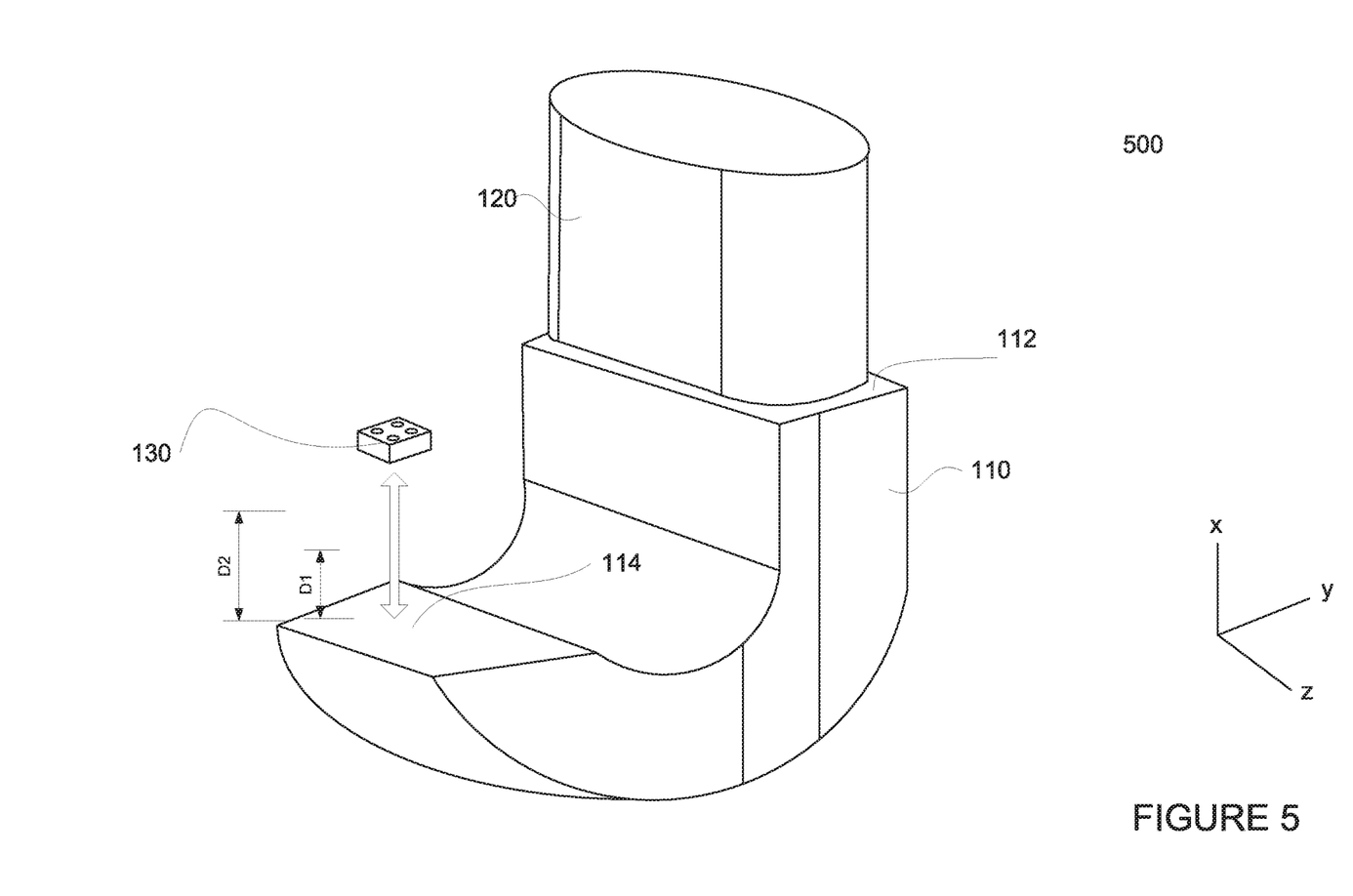
FIG. 5 illustrates an example device in accordance with aspects of the disclosure.

FIG. 5 shows an example device 500 where an extension member 110 is configured such that the magnet 120 may not move relative to the extension member 110, while the Hall Effect sensor 130 may move relative to the extension member 110. This way, the extension member 110 is always magnetized by the magnet 120. So, as the Hall Effect sensor 130 approaches the extension member 110 within a first predetermined threshold distance, the extension member 110 may transfer a magnetic field detectable by the Hall Effect sensor 130. Then, as the Hall Effect sensor 130 moves away from the extension member 110 beyond a second predetermined threshold distance, the extension member 110 may no longer transfer a magnetic field detectable by the Hall Effect sensor 130. As discussed in more detail above, the first and second predetermined threshold distances may be determined from the magnetic hysteresis curve of the extension member 110, the magnetic strength of the magnet 120, and the sensitivity of the Hall Effect sensor 130.

Figure 6:
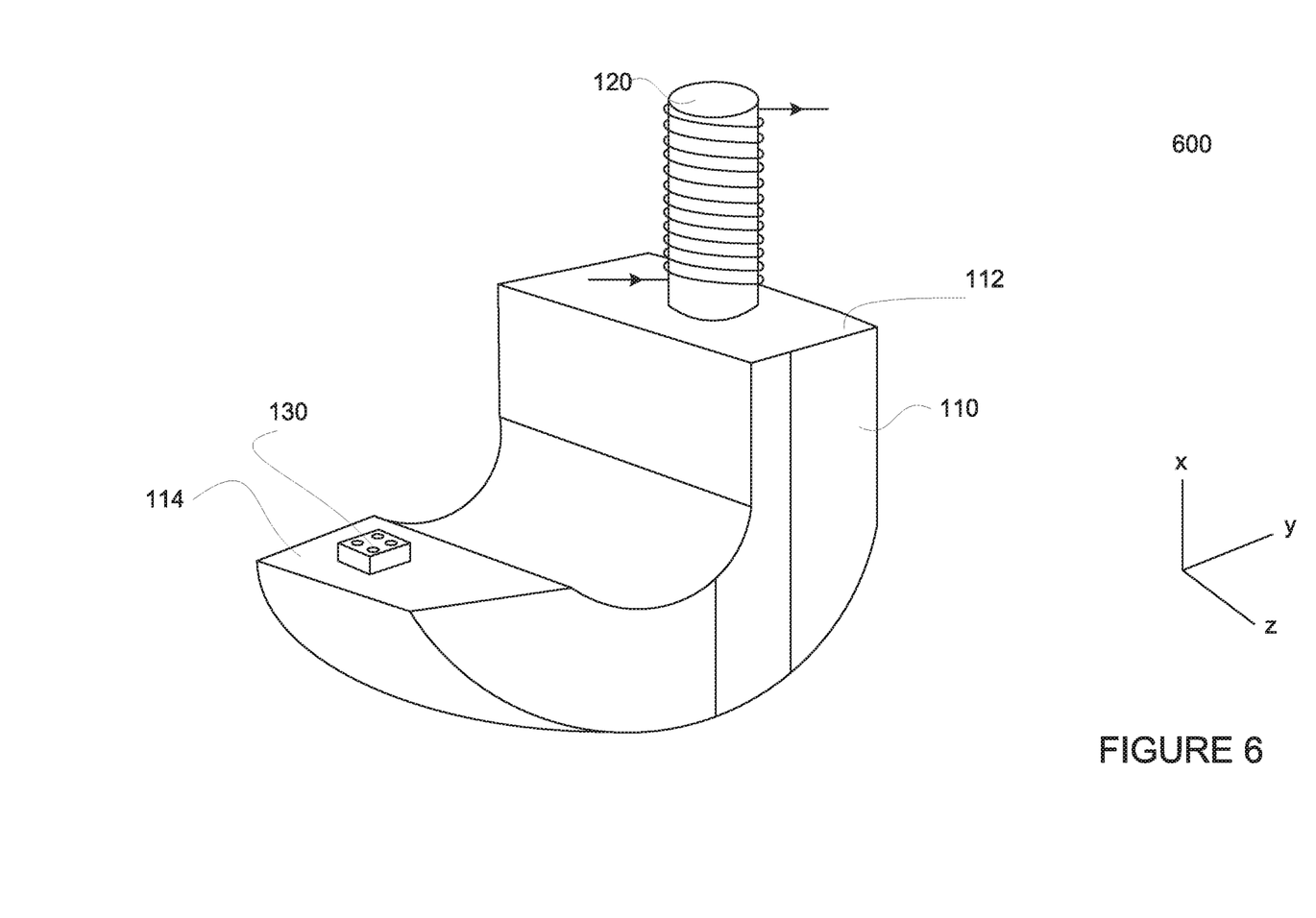
FIG. 6 illustrates an example device in accordance with aspects of the disclosure.

FIG. 6 shows an example device 600 where an extension member 110 is configured such that neither the magnet 120 nor the Hall Effect sensor 130 may move relative to the extension member 110. As discussed above, the extension member 110 may be coupled to an electromagnet, e.g., a solenoid wrapped around a ferromagnetic core. Thus, even if the magnet 120 is not moving with respect to the extension member 110 and the Hall Effect sensor 130, the magnet 120 may be an electromagnet whose magnetic field can be varied by changing the current passing through the solenoid, in such cases, the Hall Effect sensor 130 may also detect the corresponding variation in magnetic field strength through the extension member.

Figure 7:
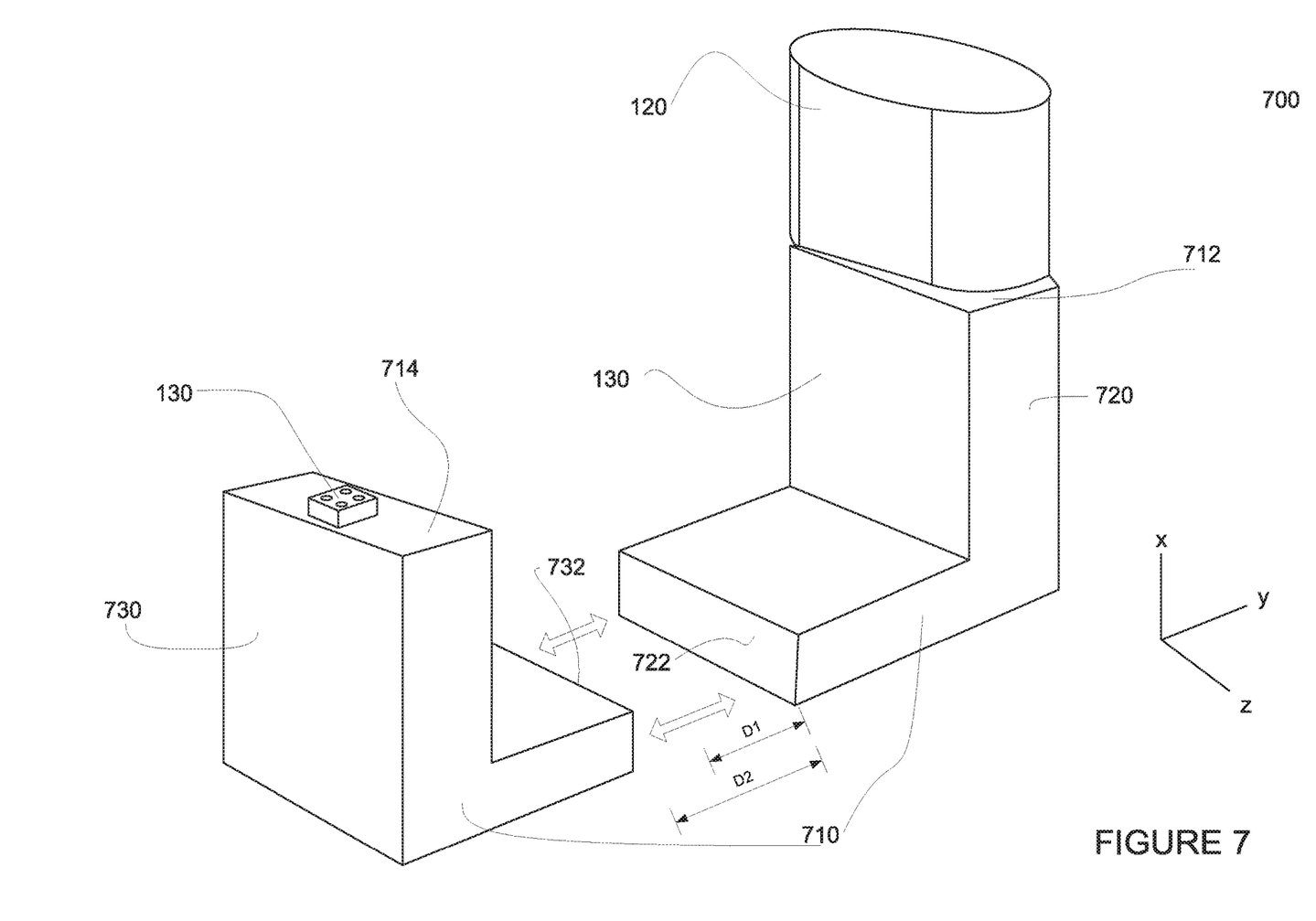
FIG. 7 illustrates an example device in accordance with aspects of the disclosure.

FIG. 7 shows an example device 700 where an extension member 710 is configured to have a first portion 720 and a second portion 730 such that the two portions may move relative to each other. The first portion 720 has a first end 712 on which a magnet 120 is fixed, and a second end 722 coupled to the second portion 730. The second portion 730 has a first end 714 on which a Hall Effect sensor 130 is attached, and a second end 732 coupled to the first portion 720. Therefore, as the first portion 720 and second portion 730 approach each other within a first predetermined threshold distance, the first portion 720 may transfer a magnetic field detectable by the Hall Effect sensor 130 via the second portion 730 to the Hall Effect sensor 130. Then, as the first portion and second portion moves away from each other beyond a second predetermined threshold distance, the first portion may no longer transfer a magnetic field detectable by the Hall Effect sensor 130 via the second portion 730 to the Hall Effect sensor 130. As discussed in more detail above, the first and second predetermined threshold distances may be determined from the magnetic hysteresis curves of the first portion 720 and the second portion 730 of the extension member 710, the magnetic strength of the magnet 120, and the sensitivity of the Hall Effect sensor 130.

Figure 8:
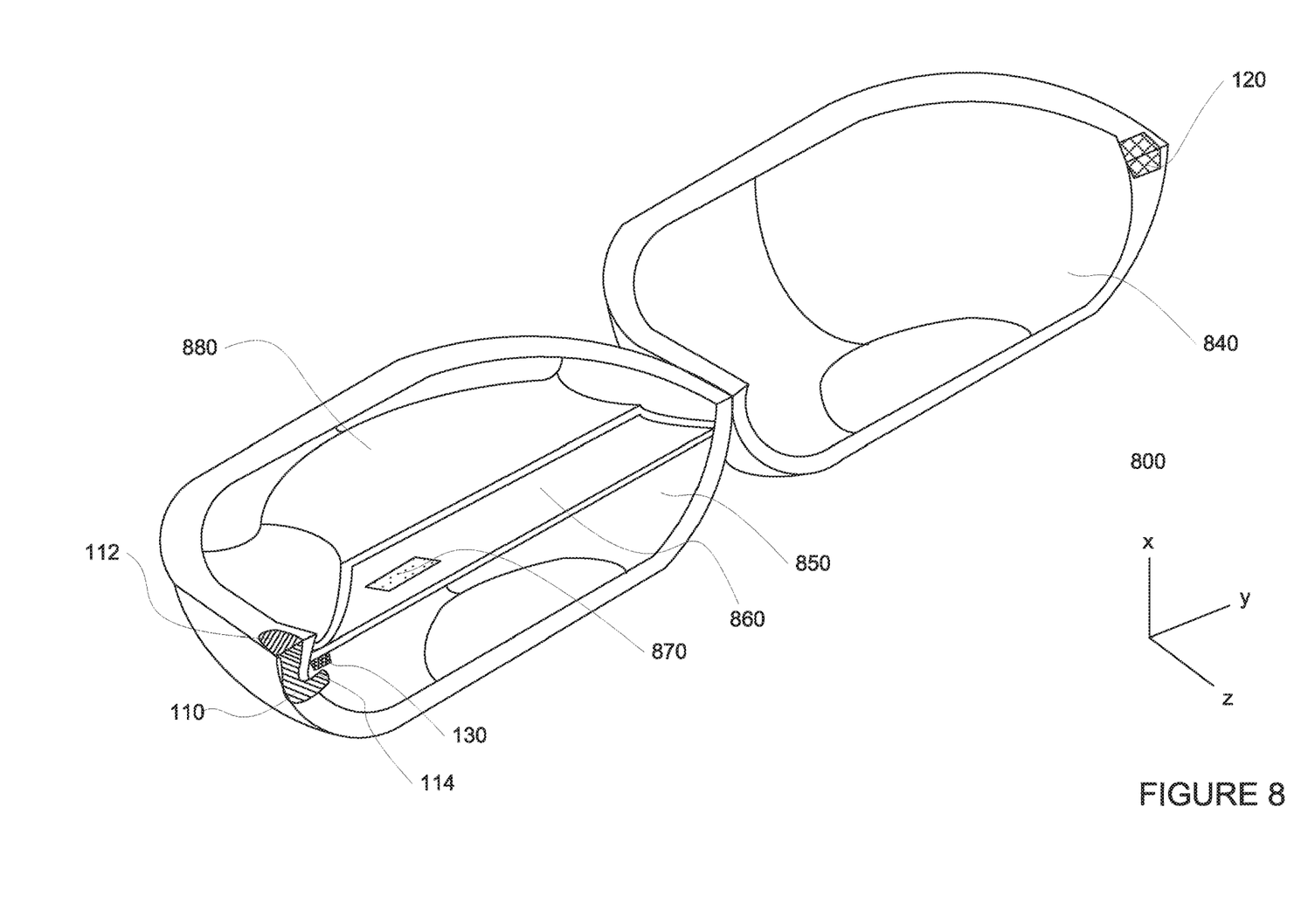
FIG. 8 illustrates an example case in an open configuration in accordance with aspects of the disclosure.
Figure 9A:
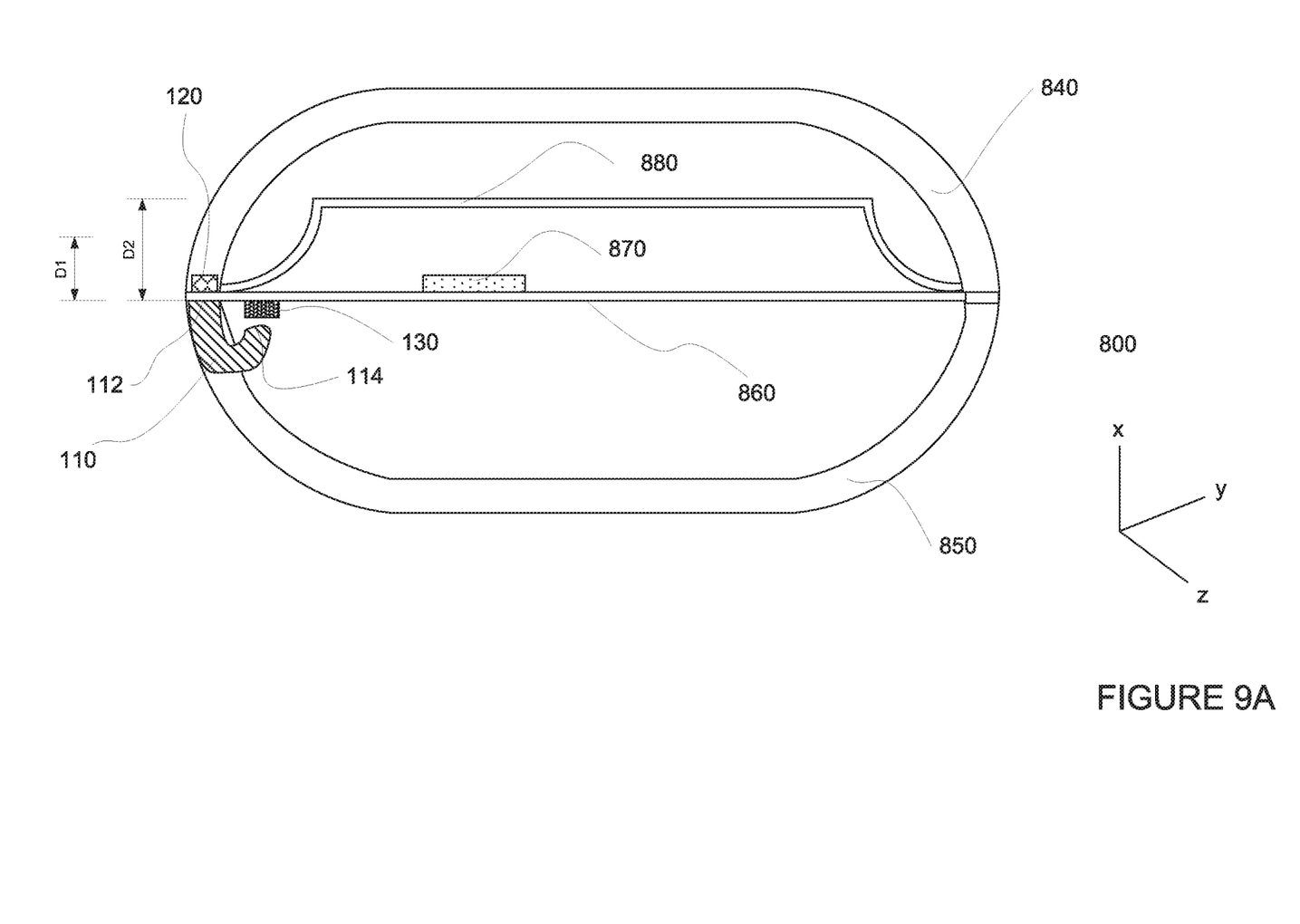
FIGS. 9A-9B illustrates example cases in a closed configuration in accordance with aspects of the disclosure.

FIGS. 8 and 9A show an example case 800 where an extension member 110 is used to direct a magnetic field from a magnet 120 to a Hall Effect sensor 130, in order to detect whether the case 800 is open or closed. In this example, the magnet 120 is mounted in a first cover 840 of the case 800, while the Hall Effect sensor 130 and the extension member 110 are mounted in a second cover 850 of the case 800. The extension member in this example is J-shaped with a first end 112 exposed and facing the magnet only when the first cover comes very near or in contact with the second cover, and a second end 114 facing the Hall Effect sensor 130 at all times.

The Hall Effect sensor 130 in this example is mounted on a circuit board, such as a printed circuit board (PCB) 860, inside the second cover 850. Here, the Hall Effect sensor 130 is mounted on a bottom side of the PCB 860 such that it directly faces the second end 114 of the extension member 110. This arrangement allows the Hall Effect sensor 130 and the extension member 110 to be within a small distance of each other, thereby increasing the sensitivity of the Hall Effect sensor 130. The Hall Effect sensor is further connected to at least one electrical component 870 on the PCB 860, e.g., a charging circuit, such that the electrical component 870 switches on when an output of the Hall Effect sensor 130 is above a first predetermined threshold value, and switches off when the output of the Hall Effect sensor 130 is below a second predetermined threshold value.

Therefore, when the case 800 is closed, for example, when the first cover 840 comes in contact with the second cover 850, the extension member 110 is within a first predetermined threshold distance D1 of the magnet 120, and therefore becomes magnetized by the magnet 120 and transfers a magnetic field detectable by the Hall Effect sensor 130. The Hall Effect sensor 130 then generates an output above the first predetermined threshold value, which switches on the electrical component 870 connected to the Hall Effect sensor 130. Additionally, because the extension member 110 is magnetized by the magnet 120, the extension member 110 provides a holding force with the magnet 120 to keep the case 800 closed.

When the case 800 is opened, for example when the first cover 840 moves away from the second cover 850, the extension member 110 is at least a second predetermined threshold distance D2 away from the magnet 120, and therefore the extension member 110 becomes demagnetized and no longer transfers a magnetic field detectable by the Hall Effect sensor 130. The Hall Effect sensor 130 then generates an output below the second predetermined threshold value, which switches off the electrical component 870 connected to the Hall Effect sensor.

Figure 9B:
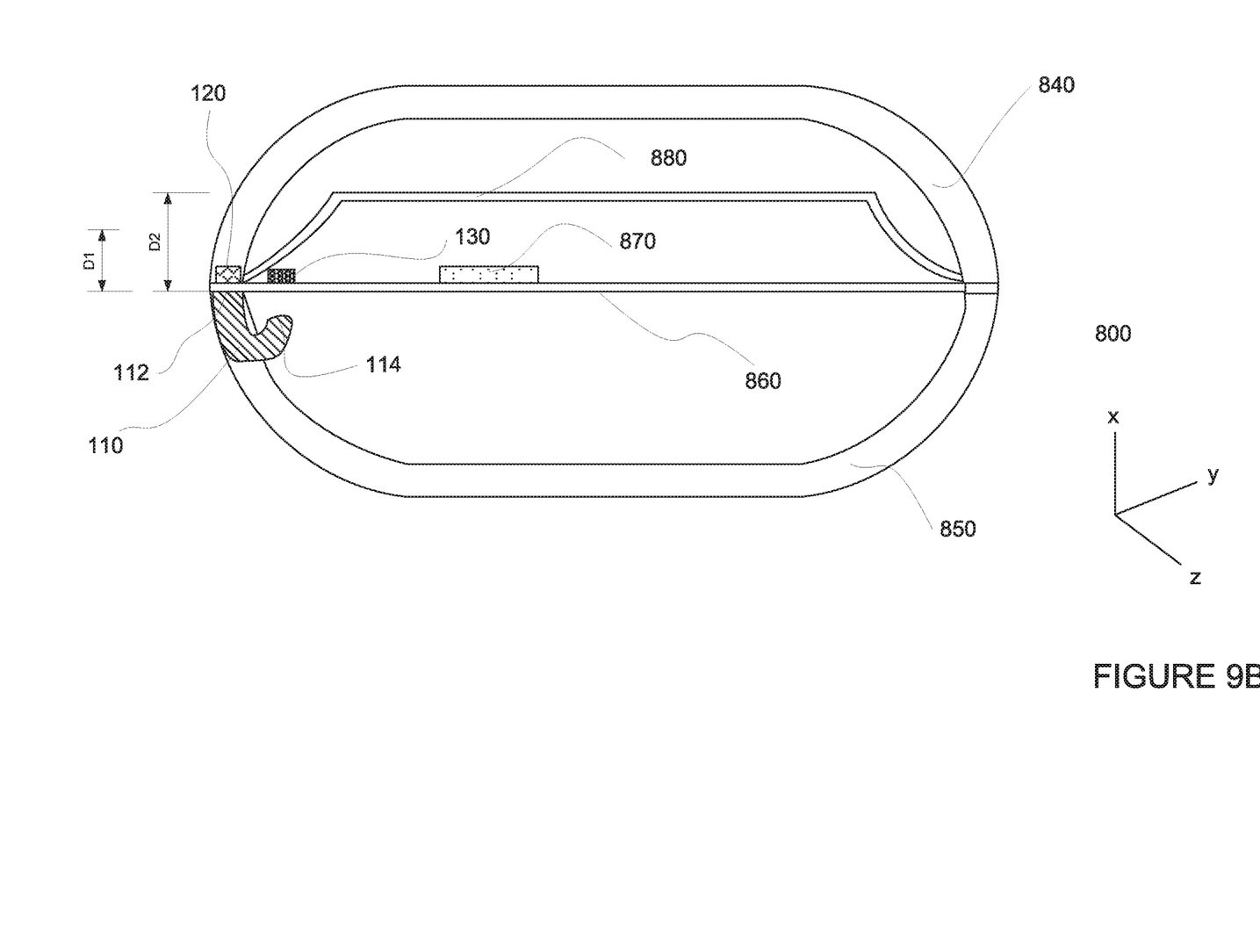

FIG. 9B shows an alternative arrangement for the example case 800. Here, the Hall Effect sensor 130 is mounted on a top side of the PCB 860 such that the PCB 860 is positioned between the Hall Effect sensor 130 and the second end 114 of the extension member 110. This alternative arrangement may be implemented, for example, where over sensitivity would result from the Hall Effect sensor 130 being mounted on the bottom side of the PCB 860 directly facing the second end 114. By mounting the Hall Effect sensor 130 on the top side of the PCB 860, the distance between the Hall Effect sensor 130 and the second end 114 may be increased as compared to the arrangement shown in FIG. 9A, which lowers the sensitivity of the Hall Effect sensor 130, which in turn increases a dynamic range for adjustment of the Hall Effect sensor 130. Further, in this alternative arrangement the PCB 860 may provide the Hall Effect sensor 130 additional protection both as a barrier against physical impact and as a barrier against electrostatic discharge through the extension member 110. The PCB 860 or copper trace will not cause B flux to change, as those are static fields.

Depending on the magnetic hysteresis curve of the extension member 110, the first predetermined threshold distance D1 may be different from the second predetermined threshold distance D2; likewise, the first predetermined threshold value may be different from the second predetermined threshold value. For example, the first predetermined threshold distance may be 1 mm-2 mm, while the second predetermined threshold distance may be 3 mm-4 mm. For another example, the first predetermined threshold value may be 1.2 V, while the second predetermined threshold value may be 0.5 V.

By choosing the Hall Effect sensor 130 and the extension member 110 with optimal hysteresis curve, the case 800 may be designed to prevent the Hall Effect sensor 130 from switching on and off the electrical component 870 when a very small variation in magnetic field results from noise, e.g., a vibration that causes the two covers to be temporarily separated by a very small distance.

Also in this example, the Hall Effect sensor 130 is sealed by a cover layer 880 such that the Hall Effect sensor 130 is protected from environmental contaminants, e.g., dust particles, water, etc. For example, the Hall Effect sensor 130 may be completely sealed inside a plastic cover that is impermeable to dust particles and water.

The technology described herein is advantageous in a number of ways. For example, compared to an infrared proximity sensor, a Hall Effect sensor costs less, consumes less power, and can be completely concealed. Where compactness is preferred or required, an extension member may be used to transfer a magnetic field from a magnet to the Hall Effect sensor without having to compromise the locations of the various components. In a device where a holding force between two components are desired, the extension member may further provide the holding force with the magnet without a need for a second magnet. Using a low remanence material, the extension member may be designed to both transfer the magnetic field and provide the holding force without saturating the Hall Effect sensor at unwanted times. The Hall Effect sensor and the extension member may also be selected based on their hysteresis curves to prevent unwanted responses to noise. The disclosed technology may further protect the Hall Effect sensor from environmental contaminants, which may prolong the life of the device.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of

The invention claimed is:

1. A device, comprising:
   a magnet;
   a Hall Effect sensor; and
   an extension member having a first portion and a second portion separated by a distance, the first portion having a first end surface mechanically coupled to the magnet and a second end surface, the first end surface and the second end surface of the first portion each having a perimeter defined by a first outer surface of the first portion, the first end surface of the first portion is closest to the magnet than any other surface of the first portion, the second portion having a first end surface mechanically coupled to the Hall Effect sensor and a second end surface adapted to be coupled to the second end surface of the first portion, the first end surface and the second end surface of the second portion each having a perimeter defined by a second outer surface of the second portion,
   wherein the distance is shortest between the second end surface of the first portion and the second end surface of the second portion,
   wherein the first portion and the second portion are configured such that the distance between the second end surface of the first portion and the second end surface of the second portion can be changed by moving the first portion or the second portion linearly along an x, y, or z plane, the extension member being formed from a material capable of transferring a magnetic field of the magnet, and
   wherein the Hall Effect sensor is not able to detect the magnetic field of the magnet when the distance between the magnet and the second portion is greater than a first predetermined threshold distance.

2. The device according to claim 1, wherein the sensor is able to detect the magnetic field of the magnet when the distance between the first portion and the second portion of the extension member is within a second predetermined threshold distance.

3. A case, comprising:
   a first cover;
   a second cover, wherein, when the case is closed, an edge of the first cover comes in contact with an edge of the second cover such that the first cover and the second cover encloses a space;
   a magnet mounted in the edge of the first cover configured to be in contact with the edge of the second cover;
   a Hall Effect sensor disposed in the enclosed space; and
   an extension member mounted in the edge of the second cover, the extension member having a first end adapted to be coupled to the magnet, a second end adapted to be coupled to the Hall Effect sensor, and a body that is bent from the edge of the second cover towards the Hall Effect sensor in the enclosed space, the body being formed from a material capable of transferring a magnetic field of the magnet from the first end to the second end.

4. The case according to claim 3, wherein the second end is positioned away from the first end in both x and y directions.

5. The case according to claim 4, wherein the first end and the second end face a same direction.

6. The case according to claim 3, wherein the second end is positioned away from the first end in x, y, and z directions.

7. The case according to claim 3, wherein the extension member has a low remanence.

8. The case according to claim 3, wherein the extension member is made of a soft iron material.

9. The case according to claim 3, wherein the extension member is configured such that a distance between the magnet and the extension member can be changed.

10. The case according to claim 3, wherein the magnet is one of a permanent magnet or an electromagnet.

11. The case according to claim 3, wherein the sensor is capable of detecting the magnetic field of the magnet when the magnet comes within a first predetermined threshold distance of the extension member.

12. The case according to claim 3, wherein the sensor is capable of detecting the magnetic field of the magnet when the magnet moves beyond a second predetermined threshold distance of the extension member.

13. The case according to claim 3, further comprising:
    at least one electrical component connected to the sensor, the electrical component configured to switch on or off depending on an output of the sensor.

14. The case according to claim 13, wherein the electrical component switches on when the output of the sensor is above a first predetermined threshold value.

15. The case according to claim 13, wherein the electrical component switches off when an output of the sensor is below a second predetermined threshold value.

16. The case according to claim 3, further comprising:
    a cover layer sealing the sensor such that the sensor is protected from environmental contaminants.

17. The case according to claim 3, further comprising:
    a circuit board;
    wherein the sensor is mounted on one of either a top side of the circuit board or a bottom side of the circuit board.

* * * * *